US010025191B2

(12) United States Patent
Shigaki et al.

(10) Patent No.: US 10,025,191 B2
(45) Date of Patent: Jul. 17, 2018

(54) POLYMER-CONTAINING COATING LIQUID APPLIED TO RESIST PATTERN

(71) Applicant: NISSAN CHEMICAL INDUSTRIES, LTD., Tokyo (JP)

(72) Inventors: Shuhei Shigaki, Toyama (JP); Yasushi Sakaida, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 59 days.

(21) Appl. No.: 15/121,242

(22) PCT Filed: Feb. 3, 2015

(86) PCT No.: PCT/JP2015/052970
§ 371 (c)(1),
(2) Date: Aug. 24, 2016

(87) PCT Pub. No.: WO2015/129405
PCT Pub. Date: Sep. 3, 2015

(65) Prior Publication Data
US 2016/0363867 A1    Dec. 15, 2016

(30) Foreign Application Priority Data

Feb. 26, 2014 (JP) .................... 2014-035855

(51) Int. Cl.
*G03F 7/075* (2006.01)
*G03F 7/40* (2006.01)
(Continued)

(52) U.S. Cl.
CPC .............. *G03F 7/405* (2013.01); *C08L 83/04* (2013.01); *C09D 183/04* (2013.01);
(Continued)

(58) Field of Classification Search
CPC . G03F 7/0752; G03F 7/38; G03F 7/40; G03F 7/11; H01L 21/0274; C08L 83/04; C09D 183/04
(Continued)

(56) References Cited

U.S. PATENT DOCUMENTS

2007/0117252 A1* 5/2007 Ogihara ................ C08G 77/48
438/72
2010/0178620 A1* 7/2010 Dei ...................... C09D 183/04
430/325

(Continued)

FOREIGN PATENT DOCUMENTS

JP    H11-124501 A    5/1999
JP    2002-040668 A    2/2002
(Continued)

OTHER PUBLICATIONS

Machine translation of JP 2010-020109 (no date).*
(Continued)

*Primary Examiner* — Amanda C Walke
(74) *Attorney, Agent, or Firm* — Oliff PLC

(57) ABSTRACT

There is provided a polymer-containing coating liquid which is applied to a resist pattern and which is used in place of a conventional rinsing liquid. A coating liquid that is applied to a resist pattern comprising a polymer having a structural unit of Formula (1):

(Continued)

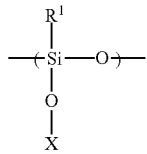

(wherein $R^1$ is a $C_{1-12}$ organic group, and X is an organic group of Formula (2):

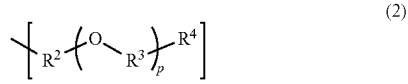

(wherein $R^2$ and $R^3$ are each independently a linear or branched alkylene group having a carbon atom number of 1 to 3, $R^2$ is bonded to an oxygen atom in Formula (1), $R^4$ is a $C_{1-4}$ alkoxy group, an allyloxy group, or a hydroxy group, and p is 0, 1, or 2)), and a solvent containing water and/or alcohols.

13 Claims, 2 Drawing Sheets

(51) Int. Cl.
    *G03F 7/11*         (2006.01)
    *C08L 83/04*      (2006.01)
    *C09D 183/04*     (2006.01)
    *G03F 7/32*         (2006.01)
    *G03F 7/16*         (2006.01)
    *G03F 7/20*         (2006.01)
    *G03F 7/38*         (2006.01)
    *H01L 21/308*     (2006.01)
(52) U.S. Cl.
    CPC .............. *G03F 7/0752* (2013.01); *G03F 7/11* (2013.01); *G03F 7/168* (2013.01); *G03F 7/2053* (2013.01); *G03F 7/322* (2013.01); *G03F 7/38* (2013.01); *G03F 7/40* (2013.01); *H01L 21/3086* (2013.01)
(58) Field of Classification Search
    USPC ... 430/270.1, 271.1, 273.1, 282.1, 322, 325, 430/329, 330, 331; 438/703; 428/448
    See application file for complete search history.

(56) References Cited

U.S. PATENT DOCUMENTS

| | | | | |
|---|---|---|---|---|
| 2012/0045899 | A1* | 2/2012 | Maruyama | G03F 7/40 438/694 |
| 2012/0122037 | A1* | 5/2012 | Bradford | G03F 7/405 430/325 |
| 2012/0276483 | A1* | 11/2012 | Ogihara | G03F 7/0752 430/319 |
| 2013/0210236 | A1* | 8/2013 | Ogihara | C07F 7/1836 438/706 |
| 2014/0120730 | A1* | 5/2014 | Nakajima | G03F 7/40 438/703 |

FOREIGN PATENT DOCUMENTS

| | | |
|---|---|---|
| JP | 2005-277052 A | 10/2005 |
| JP | 2010-007032 A | 1/2010 |
| JP | 2010-020109 A | 1/2010 |
| JP | 2010-256626 A | 11/2010 |
| JP | 2011-118373 A | 6/2011 |
| JP | 2011-137050 A | 7/2011 |
| JP | 2012-533674 A | 12/2012 |
| JP | 2012-533778 A | 12/2012 |
| WO | 2012/128251 A1 | 9/2012 |
| WO | 2013/012068 A1 | 1/2013 |

OTHER PUBLICATIONS

Oct. 3, 2015 Written Opinion issued in International Patent Application No. PCT/JP2015/052970.
Mar. 10, 2015 International Search Report issued in International Patent Application No. PCT/JP2015/052970.

\* cited by examiner

POLYMER-CONTAINING COATING LIQUID APPLIED TO RESIST PATTERN

TECHNICAL FIELD

The present invention relates to a polymer-containing coating liquid (rinsing liquid) that is used in a lithography process and is applied to a resist pattern. The present invention further relates to a method for forming a reverse pattern using the coating liquid.

BACKGROUND ART

Conventionally, a lithography process using a resist composition has been carried out in production of a semiconductor device. Due to miniaturization of a resist pattern to be formed by the lithography process, the resist pattern is likely to be collapsed. In particular, after an exposed resist film is developed, a problem frequently arises in which the resist pattern is collapsed due to flow of a rinsing liquid at a rinsing step or during drying of the rinsing liquid. Conventionally, water containing an additive such as a surfactant and an organic acid or pure water has been used as the rinsing liquid.

As a method for forming a pattern that suppresses the occurrence of a failure caused by resist pattern collapse, Patent Document 1 describes a method for forming a pattern that includes steps of forming a resist film on a substrate, selectively irradiating the resist film with an energy beam to form a latent image in the resist film, supplying a developer (alkaline developer) onto the resist film to form a resist pattern from the resist film having the latent image, supplying a rinsing liquid onto the substrate to replace the developer on the substrate with the rinsing liquid, supplying a coating film material onto the substrate to replace at least a part of the rinsing liquid on the substrate with the coating film material that contains a solvent and a solute different from the resist film, volatilizing the solvent in the coating film material to form a coating film covering the resist film on the substrate, removing at least a part of a surface of the coating film to expose at least a part of an upper surface of the resist pattern and form a mask pattern formed of the coating film, and processing the substrate using the mask pattern.

As a developer that does not cause pattern collapse during formation of a finer pattern, Patent Document 2 describes a developer containing a curable resin different from a curable resin forming a resist film and an organic solvent. Examples of the curable resin contained in the developer include a novolac resin and a polysiloxane resin.

Patent Document 3 describes a method for producing a water-soluble silicon compound having high stability by bringing a silicon compound or a condensate thereof into contact with a water-soluble compound having one or more hydroxyl groups or amino groups in one molecule, followed by bringing a silicon compound or a condensate thereof into contact with an acidic substance. Examples of the water-soluble compound include glycols.

PRIOR ART DOCUMENTS

Patent Documents

Patent Document 1: Japanese Patent Application Publication No. 2005-277052 (JP 2005-277052 A)
Patent Document 2: International Publication WO 2012/128251
Patent Document 3: Japanese Patent Application Publication No. 2010-7032 (JP 2010-7032 A)

SUMMARY OF THE INVENTION

Problem to be Solved by the Invention

Since the invention described in Patent Document 1 includes the step of supplying a rinsing liquid onto the substrate, the invention has not still solved the problem of resist pattern collapse. The invention described in Patent Document 2 is a developer. However, the developer cannot be used instead of the conventional rinsing liquid at a rinsing step after an exposed resist film is developed to form a resist pattern. Like the developer, a solution containing a polysiloxane resin has a problem of poor storage stability at room temperature when a polymer molecule of the polysiloxane resin has a plurality of hydroxyl groups bonded to Si atoms. This is because a Si—O—Si bond is formed during storage of the solution by a dehydration-condensation reaction between the polymer molecules having hydroxy groups to increase the average molecular amount of the polysiloxane resin. In the invention described in Patent Document 3, the silicon compound or the condensate thereof is brought into contact with the water-soluble compound, but a reaction of the silicon compound or the condensate thereof with the water-soluble compound is not intended. Furthermore, in the invention described in Patent Document 3, in order to obtain the water-soluble compound, it is necessary that the acidic substance is not removed after the silicon compound or a condensate thereof is brought into contact with the acidic substance at last, and a desired effect is not obtained when the silicon compound or a condensate thereof is not brought into contact with the acidic substance.

Means for Solving the Problems

The inventors of the present invention has intensively investigated to solve the above-described problems, and as a result, found that when a composition containing a polymer having a specific structural unit and a solvent containing water and/or an alcohol is used as a coating liquid, a problem of collapse of a resist pattern at a rinsing step can be solved even though the coating liquid stored at room temperature is used, and a reverse pattern to be used as a mask at an etching step can be formed.

Specifically, the present invention relates to a coating liquid that is applied to a resist pattern comprising a polymer having a structural unit of Formula (1):

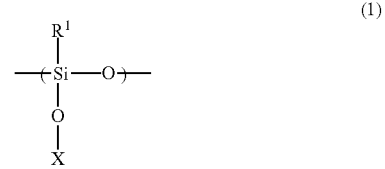

(wherein $R^1$ is a $C_{1-12}$ organic group, and X is an organic group of Formula (2):

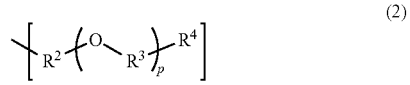

(wherein $R^2$ and $R^3$ are each independently a linear or branched alkylene group having a carbon atom number of 1 to 3, $R^2$ is bonded to an oxygen atom in Formula (1), $R^4$ is a $C_{1-4}$ alkoxy group, an allyloxy group, or a hydroxy group, and p is 0, 1, or 2)), and a solvent containing water and/or alcohols.

The polymer may further have a structural unit of Formula (3):

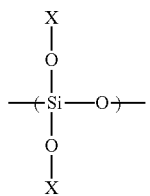
(3)

(wherein two Xs are each defined the same as in Formula (1)).

A polymer having the structural unit of Formula (1) and the structural unit of Formula (3) is a product obtained by a reaction of a cohydrolysis-condensation product of a compound of Formula (4) and a compound of Formula (5) with a compound of Formula (6):

(4)

(5)

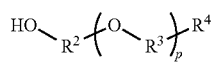
(6)

(wherein $R^1$ is defined the same as in Formula (1), Y and Z are each independently a methyl group or an ethyl group, and $R^2$, $R^3$, $R^4$, and p are each defined the same as in Formula (2)).

Examples of the compound of Formula (4) include β-(2-triethoxysilylethyl)-γ-butyrolactone.

As described above, when the cohydrolysis-condensation product of the compound of Formula (4) and the compound of Formula (5) is reacted with the compound of Formula (6), a hydrogen atom of hydroxy group bonded to a Si atom in the polymer molecule is substituted with the organic group of Formula (2) that defines X. As a result, the number of the hydroxyl groups bonded to a Si atom in the polymer molecule is decreased as compared with the state before the reaction.

The $C_{1-12}$ organic group that defines $R^1$ is selected from the group consisting of linear, branched, or cyclic alkyl groups, vinyl groups, allyl groups, phenyl groups, and groups of Formulae (7) to (13):

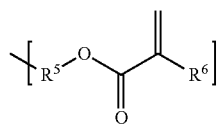
(7)

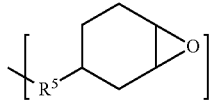
(8)

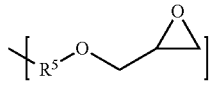
(9)

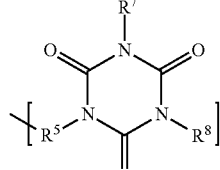
(10)

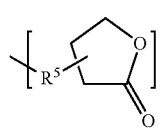
(11)

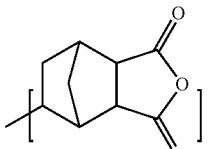
(12)

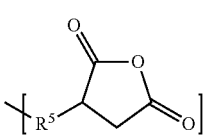
(13)

(wherein $R^5$ is a linear or branched alkylene group having a carbon atom number of 1 to 3, $R^5$ is bonded to a Si atom in Formula (1), $R^6$ is a hydrogen atom or a methyl group, and $R^7$ and $R^8$ are each independently a hydrogen atom or an allyl group). When the $C_{1-12}$ organic group is particularly selected from the groups of Formulae (11), (12), and (13), an effect of improving the storage stability of the coating liquid is exhibited.

The group of Formula (11) is, for example, a group of Formula (11′).

(11′)

Examples of the linear or branched alkylene group having a carbon atom number of 1 to 3 include methylene group (—$CH_2$— group), ethylene group (—$CH_2CH_2$— group), trimethylene group (—$CH_2CH_2CH_2$— group), and propylene group (—$CH(CH_3)CH_2$— group). Examples of the $C_{1-4}$ alkoxy group include methoxy group (—$OCH_3$ group), ethoxy group (—$OCH_2CH_3$ group), n-propoxy group (—$OCH_2CH_2CH_3$ group), isopropoxy group (—$OCH(CH_3)_2$ group), n-butoxy group (—$OCH_2CH_2CH_2CH_3$ group), isobutoxy group (—$OCH_2CH(CH_3)_2$ group), sec-butoxy group (—$OCH(CH_3)CH_2CH_3$ group), and tert-butoxy group (—$OC(CH_3)_3$ group). In Formula (2), when p is 0, $R^2$ is bonded to $R^4$ through a single bond.

In the solvent containing water and/or alcohols, the alcohols are, for example, compounds of Formula (6):

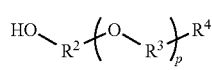

(6)

(wherein $R^2$, $R^3$, $R^4$, and p are each defined the same as in Formula (2)).

In the solvent containing water and/or alcohols, examples of water include pure water and ultrapure water. The solvent containing water and/or alcohols may be water, the alcohols, or a mixture of water and the alcohols, and the alcohols may be used singly or as a mixture of two or more thereof. When the solvent containing water and/or alcohols is a mixture of water and the alcohols, the content of the alcohols in the mixture is, for example, 10% by mass to 70% by mass, and preferably 30% by mass to 50% by mass. The content of the alcohols is a value relative to 100% by mass of the mixture of water and the alcohols.

The concentration of the polymer in the coating liquid of the present invention is, for example, 0.5% by mass to 20% by mass. The concentration of the polymer is a value relative to 100% by mass of the coating liquid of the present invention. As the concentration is higher, provided that the upper limit is 40% by mass, the thickness of a coating film to be formed can be increased.

The coating liquid of the present invention can be used instead of the conventional rinsing liquid. Therefore, the coating liquid can be referred to as a rinsing liquid.

Another aspect of the present invention is a method for forming a reverse pattern comprising steps of applying a positive resist solution to a substrate having an underlayer film, followed by prebaking, to form a resist film, exposing the resist film, heating (PEB: post exposure bake) the resist film after the exposure, and developing the resist film by an alkaline developer to form a resist pattern on the substrate having the underlayer film, applying the coating liquid of the present invention to the resist pattern such that at least spaces between patterns of the resist pattern are filled, and removing or decreasing a component other than the polymer contained in the coating liquid and the alkaline developer to form a coating film, etch-backing the coating film to expose a surface of the resist pattern, and removing the resist pattern.

In order to remove or decrease the component other than the polymer contained in the coating liquid and the alkaline developer, for example, the substrate coated with the coating liquid is spin-dried or spin-dried and heated. Herein, the spin-drying is drying under rotation of the substrate. The component other than the polymer contained in the coating liquid is the solvent, and an additive to be added, if necessary.

The step of removing the resist pattern is carried out, for example, by dry etching or ashing. Herein, when ashing is selected, the ashing needs to be carried out under a condition where a component other than the resist pattern, particularly the underlayer film, is not removed.

Yet another aspect of the present invention is a method for producing a semiconductor device comprising, after formation of a reverse pattern by the method of the present invention, a step of etching the substrate having the underlayer film using the reverse pattern as a mask. The step of etching the substrate having the underlayer film is carried out, for example, by dry etching.

Effects of the Invention

Since at least a part of hydrogen atoms of hydroxyl groups in the polymer molecules is substituted with the organic group of Formula (2), the coating liquid of the present invention has excellent storage stability. Therefore, the coating liquid can be stored at room temperature. Even when an organic acid is not added, the coating liquid exhibits excellent storage stability. When the coating liquid of the present invention is used, a rinsing step using the conventional rinsing liquid is not necessary. Accordingly, the collapse of a resist pattern can be suppressed.

MODES FOR CARRYING OUT THE INVENTION

Figure 1:
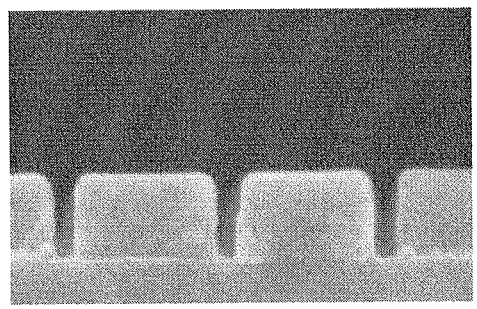
FIG. 1 is a cross-sectional SEM image illustrating a pattern profile of a reverse pattern that is obtained by forming a coating film on a resist pattern using a coating liquid of Preparation Example 3 and dry etching the coating film.
Figure 2:
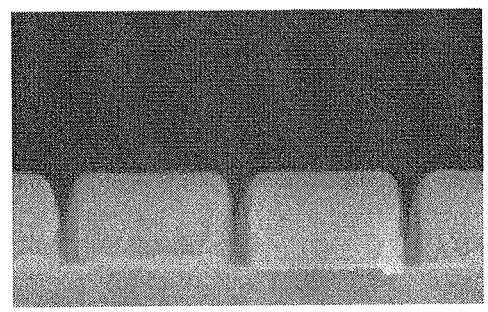
FIG. 2 is a cross-sectional SEM image illustrating a pattern profile of a reverse pattern that is obtained by forming a coating film on a resist pattern using a coating liquid of Preparation Example 7 and dry etching the coating film.
Figure 3:
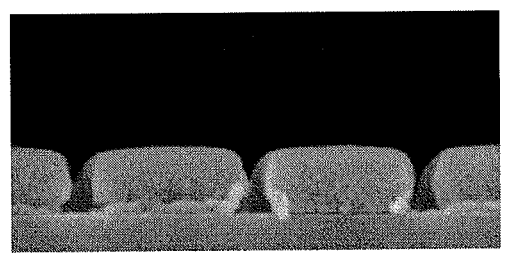
FIG. 3 is a cross-sectional SEM image illustrating a pattern profile of a reverse pattern that is obtained by forming a coating film on a resist pattern using a coating liquid of Preparation Example 10 and dry etching the coating film.
Figure 4:
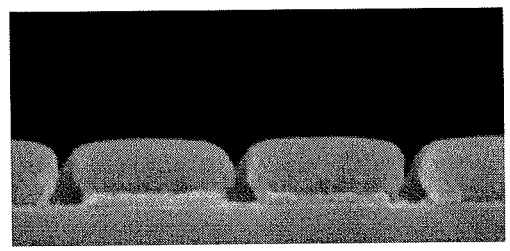
FIG. 4 is a cross-sectional SEM image illustrating a pattern profile of a reverse pattern that is obtained by forming a coating film on a resist pattern using a coating liquid of Preparation Example 11 and dry etching the coating film.

Hereinafter, embodiments of the present invention will be described in detail.

<Polymer>

The polymer having a structural unit of Formula (1) can be obtained by dissolving the compound of Formula (4) in a solvent containing water, causing a hydrolysis-condensation reaction in the presence of a catalyst to obtain a solution, adding the compound of Formula (6) to the obtained solution, and distilling the solvent containing water, the catalyst, and the like, off under reduced pressure. The polymer having the structural unit of Formula (1) and the structural unit of Formula (3) can be obtained using the compound of Formula (5), in addition to the compound of Formula (4), by the same method as described above. Examples of the compound of Formula (6) include propylene glycol monomethyl ether, propylene glycol monoethyl ether, propylene glycol monopropyl ether, propylene glycol monobutyl ether, ethylene glycol monomethyl ether, ethylene glycol monoethyl ether, ethylene glycol monopropyl ether, ethylene glycol monobutyl ether, ethylene glycol monoallyl ether, dipropylene glycol monomethyl ether, diethylene glycol monomethyl ether, diethylene glycol monobutyl ether, triethylene glycol monomethyl ether, triethylene glycol monoethyl ether, triethylene glycol monopropyl ether, triethylene glycol monobutyl ether, ethylene glycol, 1,2-propanediol or 1,3-propanediol, diethylene glycol, dipropylene glycol, diisopropylene glycol, and triethylene glycol. Preferred examples of the catalyst include inorganic acids such as hydrochloric acid and nitric acid, and organic acids such as formic acid, oxalic acid, fumaric acid, maleic acid, glacial acetic acid, acetic anhydride, propionic acid, and n-butyric acid. The amount of catalyst to be used is, for example, 0.001% by mass to 1% by mass, relative to the mass of the compound of Formula (4) or the total mass of the compound of Formula (4) and the compound of Formula (5). The hydrolysis-condensation reaction and the cohydrolysis-condensation reaction are carried out, for example, under a temperature condition of 30° C. to 80° C.

The structural unit of Formula (1) and the structural unit of Formula (3) in the polymer contained in the coating liquid of the present invention may form any structure of a random copolymer, a block copolymer, and an alternating copolymer.

In the structural unit of Formula (1) and the structural unit of Formula (3), specific examples of the organic group that defines X are shown in Formulae (2-1) to (2-25). In the following formulae, Me is a methyl group, Et is an ethyl group, Pr is a n-propyl group, and Bu is a n-butyl group.

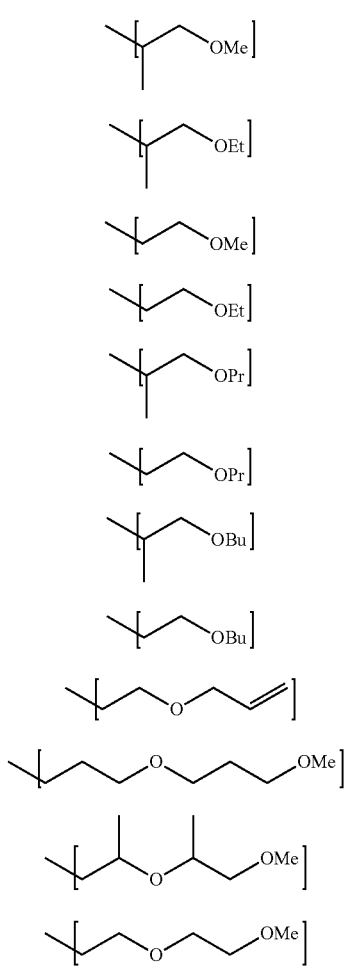

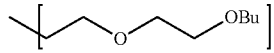
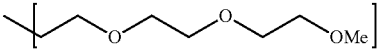
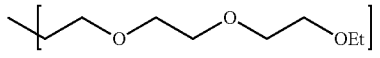
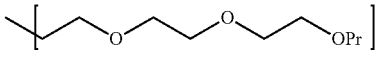
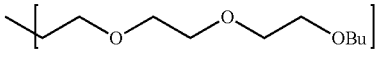
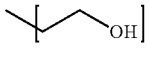
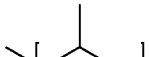
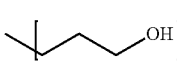
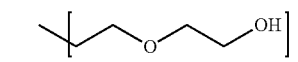
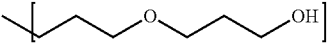
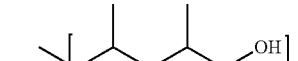
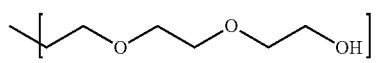

<Additive>

To the coating liquid of the present invention, an organic acid may be added. Examples of the organic acid include maleic acid, formic acid, acetic acid, maleic anhydride, oxalic acid, citric acid, and phosphoric acid. When the coating liquid of the present invention contains the organic acid, the content thereof is, for example, 0.1% by mass to 10% by mass relative to the coating liquid of the present invention. The organic acid as an additive may be also referred to as a pH adjustor.

To the coating liquid of the present invention, a surfactant may be added. The surfactant is an additive for improving the coating property of the coating liquid of the present invention. A known surfactant such as a nonionic surfactant and a fluorosurfactant can be used. The content thereof is, for example, 0.1% by mass or more and 5% by mass or less relative to the polymer contained in the coating liquid of the present invention.

Examples of the surfactant include nonionic surfactants such as polyoxyethylene alkyl ethers such as polyoxyethylene lauryl ether, polyoxyethylene stearyl ether, polyoxyethylene cetyl ether, and polyoxyethylene oleyl ether, polyoxyethylene alkyl aryl ethers such as polyoxyethylene octyl phenyl ether and polyoxyethylene nonyl phenyl ether, polyoxyethylene-polyoxypropylene block copolymers, sorbitan fatty acid esters such as sorbitan monolaurate, sorbitan monopalmitate, sorbitan monostearate, sorbitan monooleate, sorbitan trioleate, and sorbitan tristearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorosurfactants including EFTOP [registered trademark] EF301, EF303, and EF352 (manufactured by Mitsubishi Materials Electronic Chemicals Co., Ltd.), MEGAFACE [registered trademark] F171, F173, R-30, R-40, and R-40-LM (manufactured by DIC Corporation), Fluorad FC430 and FC431 (manufactured by Sumitomo 3M, Ltd.), and Asahi Guard [registered trademark] AG710, and Surflon [registered trademark] S-382, SC101, SC102, SC103, SC104, SC105, and SC106 (manufactured by Asahi Glass Co., Ltd.), and organosiloxane polymer KP341 (manufactured by Shin-Etsu Chemical Co., Ltd.). These surfactants may be added singly or in combination of two or more of them.

[Method for Forming Reverse Pattern]

As described above, the method for forming a reverse pattern of the present invention has the step of applying a positive resist solution to a substrate having an underlayer film, followed by prebaking, to form a resist film. Examples of the substrate include substrates to be used in production of a precision integrated circuit element (e.g., a semiconductor substrate such as a silicon substrate coated with a silicon oxide film, a silicon nitride film, or a silicon nitride oxide film, a silicon nitride substrate, a quartz substrate, an alkali-free glass substrate, a low alkaline glass substrate, a crystalline glass substrate, and a glass substrate having an ITO film). On the substrate, an organic film and/or inorganic film having an anti-reflective performance is formed as an underlayer film.

Specifically, a positive resist solution is applied to the underlayer film by an appropriate coating process such as a spinner and a coater, and dried, for example, by prebaking at a temperature of about 80° C. to about 180° C., to form a resist film. In this case, the resist film has, for example, a thickness of 10 nm to 1,000 nm. Examples of the positive resist solution include PAR710 and PAR855, manufactured by Sumitomo Chemical Co., Ltd., and AR2772JN manufactured by JSR Corporation.

Next, at the step of exposing the resist film, the exposure is carried out using a source of light such as visible light (g-line), ultraviolet light (i-line, KrF excimer laser, and ArF excimer laser), extreme ultraviolet light (EUV), and electron beam through a mask of a predetermined pattern.

Next, at the step of developing the exposed resist film by an alkaline developer to from a resist pattern on the substrate having the underlayer film, examples of the alkaline developer include aqueous solutions of alkalis including inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide, tetraethylammonium hydroxide, and choline, and cyclic amines such as pyrrole and piperidine. Furthermore, proper amounts of alcohols such as isopropyl alcohol and surfactants such as a nonionic surfactant are added to the aqueous solution of the alkalis. Among the developers, an aqueous solution of quaternary ammonium salt is preferred, and an aqueous solution of tetramethylammonium hydroxide is further preferred. In the present invention, after the development by the alkaline developer, a step of washing with the conventional rinsing liquid followed by drying is not necessary.

At the step of applying the coating liquid of the present invention to the resist pattern such that at least spaces between patterns of the resist pattern are filled, and removing or decreasing the component other than the polymer contained in the coating liquid and the alkaline developer to form a coating film, the coating liquid of the present invention is applied by an appropriate coating method such as a spinner and a coater. In a case of heating after spin-drying to remove or decrease the component other than the polymer and the alkaline developer, the solvent in the coating film can be rapidly volatilized, for example, by heating at 80° C. to 180° C. At that time, the heating time is, for example, 10 seconds to 300 seconds. The thickness of the coating film is not particularly limited, and is, for example, 10 nm to 1,000 nm.

Next, at the step of etch-backing the coating film to expose a surface of the resist pattern, the etch-backing is carried out, for example, by dry etching using a fluorine-containing gas such as $CF_4$, wet etching using an aqueous solution of organic acid or organic base or an organic solvent, or a CMP method. A process condition can be appropriately adjusted.

At the step of removing the resist pattern, for example, a mixed gas of $O_2$ and $N_2$ or $O_2$ gas is used. A desired reverse pattern is formed of the coating film remaining after the removal of the resist pattern. For the dry etching, a publicly known apparatus can be used.

EXAMPLES

Hereinafter, the present invention will be described in detail with reference to Examples, but the present invention is not especially limited to the Examples.

A weight average molecular weight shown in the following Synthesis Examples herein is a result measured by gel permeation chromatography (hereinafter abbreviated as GPC). A measurement apparatus to be used, a measurement condition, and the like are as follows.

[GPC Conditions]
GPC apparatus: HLC-8220GPC (manufactured by TOSOH CORPORATION)
GPC column: Shodex [registered trademark] KF803L, KF802, KF801 (manufactured by Showa Denko K. K.)
Column temperature: 40° C.
Solvent: tetrahydrofuran (THF)
Flow rate: 1.0 mL/min
Standard sample: polystyrene (available from Showa Denko K. K.)

Synthesis Example 1

16.7 g (30% by mole) of tetraethoxysilane, 33.3 g (70% by mole) of methyltriethoxysilane, 100 g of acetone, and 100 g of ultrapure water were placed in a 500-mL flask, and 4.8 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. The reaction solution was then cooled to room temperature. 60.0 g of propylene glycol monomethyl ether was added to the reaction solution, and acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 700 in terms of polystyrene.

Synthesis Example 2

16.7 g (30% by mole) of tetraethoxysilane, 33.3 g (70% by mole) of methyltriethoxysilane, 100 g of acetone, and 100 g of ultrapure water were placed in a 500-mL flask, and 4.8 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. 4.8 g of 1% by mass maleic acid aqueous solution was added to the reaction solution, 100 g of propylene glycol monomethyl ether was further added. Acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 1,200 in terms of polystyrene.

Synthesis Example 3

5.8 g (30% by mole) of tetraethoxysilane, 6.7 g (40% by mole) of methyltriethoxysilane, 9.2 g (30% by mole) of 5-(triethoxysilyl)norbornane-2,3-dicarboxylic acid anhydride that was a compound of Formula (4-1), 43 g of acetone, and 43 g of ultrapure water were placed in a 200-mL flask, and 1.7 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. The reaction solution was then cooled to room temperature. 24.0 g of propylene glycol monomethyl ether was added to the reaction solution, and acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 1,000 in terms of polystyrene.

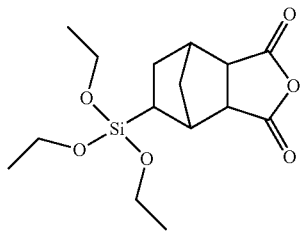

(4-1)

Synthesis Example 4

5.8 g (30% by mole) of tetraethoxysilane, 6.7 g (40% by mole) of methyltriethoxysilane, 7.7 g (30% by mole) of β-(2-triethoxysilylethyl)-γ-butyrolactone that was a compound of Formula (4-2), 40 g of acetone, and 40 g of ultrapure water were placed in a 200-mL flask, and 1.7 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. The reaction solution was then cooled to room temperature. 24.0 g of propylene glycol monomethyl ether was added to the reaction solution, and acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 800 in terms of polystyrene.

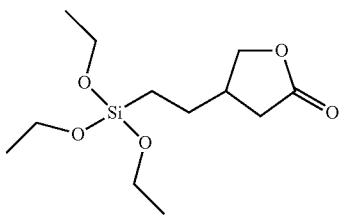

(4-2)

Synthesis Example 5

5.8 g (30% by mole) of tetraethoxysilane, 6.7 g (40% by mole) of methyltriethoxysilane, 6.9 g (30% by mole) of 2-(3,4-epoxycyclohexyl)ethyltrimethoxysilane that was a compound of Formula (4-3), 43 g of acetone, and 43 g of ultrapure water were placed in a 200-mL flask, and 1.7 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. The reaction solution was then cooled to room temperature. 24.0 g of propylene glycol monomethyl ether was added to the reaction solution, and acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 2,000 in terms of polystyrene.

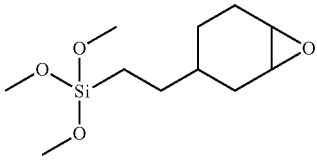

(4-3)

Synthesis Example 6

5.8 g (30% by mole) of tetraethoxysilane, 6.7 g (40% by mole) of methyltriethoxysilane, 6.6 g (30% by mole) of 3-glycidyloxypropyltrimethoxysilane that was a compound of Formula (4-4), 43 g of acetone, and 43 g of ultrapure water were placed in a 200-mL flask, and 1.7 g of 0.01 mol/L hydrochloric acid was added dropwise to the mixed solution in the flask with stirring by a magnetic stirrer. After the adding dropwise, the flask was placed into an oil bath adjusted to 40° C., and a reaction was caused for 240 minutes under heating reflux. The reaction solution was then cooled to room temperature. 24.0 g of propylene glycol monomethyl ether was added to the reaction solution, and acetone, water, and hydrochloric acid, as well as ethanol as a reaction byproduct were distilled off under reduced pressure from the reaction solution to concentrate the reaction solution. Thus, a solution of propylene glycol monomethyl ether was obtained as a cohydrolysis-condensation product (polymer). The solid content concentration was adjusted to 15% by mass in terms of solid residue at 140° C. The weight average molecular weight Mw by GPC was 2,000 in terms of polystyrene.

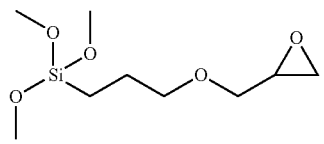

(4-4)

Comparative Synthesis Example 1

16.7 g (30% by mole) of tetraethoxysilane, 33.3 g (70% by mole) of methyltriethoxysilane, 100 g of acetone, and 100 g of ultrapure water were placed in a 500-mL flask, and 4.8 g of 0.01 mol/L hydrochloric acid was added dropwise to the mixed solution in the flask with stirring by a magnetic stirrer. After the dropwise addition, the flask was placed into an oil bath adjusted to 40° C., and a reaction was caused for 240 minutes under heating reflux. Subsequently, acetone, water, and hydrochloric acid, as well as ethanol as a reaction byproduct were distilled off under reduced pressure from the reaction solution to concentrate the reaction solution. Thus, an aqueous solution of cohydrolysis-condensation product (polymer) was obtained. The weight average molecular weight Mw by GPC was 600 in terms of polystyrene.

[Preparation of Coating Liquid]

To the polymer solution obtained in each of Synthesis Examples 1 to 6 and Comparative Synthesis Example 1 described above, a solvent containing propylene glycol monomethyl ether and water at a ratio described in the following Table 1 was added, and a coating liquid was prepared. As the water, ultrapure water was used. The content of the polymer shown in Table 1 does not indicate the content of the polymer solution, but indicates the content of solid content other than the solvent in the polymer solution. The content of each component is expressed in part by mass. In Table 1, propylene glycol monomethyl ether is abbreviated as PGME.

TABLE 1

|  | Polymer | Solvent |
|---|---|---|
| Preparation Example 1 Content | Synthesis Example 1 4 | PGME/Water 0/100 |
| Preparation Example 2 Content | Synthesis Example 1 4 | PGME/Water 10/90 |
| Preparation Example 3 Content | Synthesis Example 1 4 | PGME/Water 30/70 |
| Preparation Example 4 Content | Synthesis Example 1 4 | PGME/Water 50/50 |
| Preparation Example 5 Content | Synthesis Example 1 4 | PGME/Water 70/30 |
| Preparation Example 6 Content | Synthesis Example 1 4 | PGME/Water 100/0 |
| Preparation Example 7 Content | Synthesis Example 2 4 | PGME/Water 30/70 |
| Preparation Example 8 Content | Synthesis Example 3 4 | PGME/Water 30/70 |
| Preparation Example 9 Content | Synthesis Example 4 4 | PGME/Water 30/70 |
| Preparation Example 10 Content | Synthesis Example 5 4 | PGME/Water 30/70 |
| Preparation Example 11 Content | Synthesis Example 6 4 | PGME/Water 30/70 |
| Comparative Preparation Example 1 Content | Comparative Synthesis Example 1 4 | PGME/Water 0/100 |

Hereinafter, the results of evaluation using the coating liquid of the present invention are shown.

[Storage Stability of Coating Liquid]

The coating liquids of Preparation Examples 1 to 11 and Comparative Preparation Example 1 were stored in a thermostatic oven of 23° C. for 1 month, and the storage stability of the coating liquids after 1 month was visually observed. The results are summarized in Table 2 below. In Table 2, "good" shows that the coating liquid was a transparent solution, and "poor" shows that the coating liquid changes to a semi-transparent solution with a white precipitate produced. In only Examples 1 to 11 using the coating liquids of Preparation Examples 1 to 11, respectively, the storage stability was evaluated as "good."

TABLE 2

| Coating Liquid |  | Storage Stability |
|---|---|---|
| Example 1 | Preparation Example 1 | Good |
| Example 2 | Preparation Example 2 | Good |
| Example 3 | Preparation Example 3 | Good |
| Example 4 | Preparation Example 4 | Good |
| Example 5 | Preparation Example 5 | Good |
| Example 6 | Preparation Example 6 | Good |
| Example 7 | Preparation Example 7 | Good |
| Example 8 | Preparation Example 8 | Good |
| Example 9 | Preparation Example 9 | Good |
| Example 10 | Preparation Example 10 | Good |
| Example 11 | Preparation Example 11 | Good |
| Comparative Example 1 | Comparative Preparation Example 1 | Poor |

[Embedding of Resist Pattern by ArF Exposure]

A commercially available resist underlayer film-forming composition (resin component was a methacrylate copolymer) was applied to a silicon substrate by a spinner, heated at 205° C. for 60 seconds to form a resist underlayer film having a thickness of 28 nm. A resist solution for ArF (trade name: AR2772JN, manufactured by JSR Corporation) was applied to the film by a spinner. The silicon substrate was heated at 110° C. for 90 seconds on a hot plate to form a resist film having a thickness of 210 nm. The resist film was exposed by an exposure apparatus for ArF excimer laser (S307E, manufactured by Nikon Corporation) under a predetermined condition. After the exposure in which a target line width was set to 65 nm and a target space width was set to 195 nm, the silicon substrate was heated (PEB) at 110° C. for 90 seconds, and cooled to room temperature on a cooling plate. After that, development was carried out using a 2.38% by mass tetramethylammonium aqueous solution to form a resist pattern. Subsequently, the coating liquid of Preparation Example 3, 7, 10, or 11 was applied to the resist pattern to replace the 2.38% by mass tetramethylammonium aqueous solution used in the development to this coating liquid. The silicon substrate was then spun at 1,500 rpm for 60 seconds to dry the solvent in the coating liquid, and heated at 100° C. for 60 seconds to form a coating film. Thus, the resist pattern was embedded in the coating film.

The coating film formed using the coating liquid of Preparation Example 3, 7, 10, or 11 was etch-backed by dry etching using a mixed gas of $CF_4$ (flow rate: 50 sccm) and Ar (flow rate: 200 sccm) to expose an upper portion of the resist pattern. The resist pattern was then removed by dry etching using a mixed gas of $O_2$ (flow rate: 10 sccm) and $N_2$ (flow rate: 20 sccm) to obtain a reverse pattern.

Figure 5:
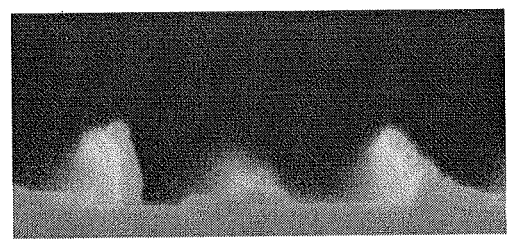
FIG. 5 is a cross-sectional SEM image illustrating a pattern profile of a resist pattern after development followed by rinsing using pure water as a rinsing liquid.

Embedding was carried out using each of the coating liquids of Preparation Examples 3, 7, 10, and 11. The results were observed by cross-sectional SEM. Furthermore, the pattern profiles of the reverse patterns obtained after dry etching were observed by cross-sectional SEM. The results are shown in FIGS. 1, 2, 3, and 4. In Comparative Example 2, rinsing was carried out using pure water as the conventional rinsing liquid instead of applying of the coating liquid of Preparation Example 3, 7, 10, or 11 to the developed resist pattern, and the pattern profile of the resist pattern was observed by cross-sectional SEM. The results are shown in FIG. 5. The evaluation results of embedding properties and pattern profiles of the patterns are summarized in Table 3 below. In Table 3, "good" in the pattern embedding properties shows that the resist pattern is embedded without generation of a void, and "good" in the pattern profile shows that a reverse pattern is formed without collapse of the pattern.

TABLE 3

| Coating Liquid | Pattern embedding property | Pattern profile |
| --- | --- | --- |
| Example 3 | Preparation Example 3 | Good | Good |
| Example 7 | Preparation Example 7 | Good | Good |
| Example 10 | Preparation Example 10 | Good | Good |
| Example 11 | Preparation Example 11 | Good | Good |
| Comparative Example 2 | None | None | Pattern collapse |

INDUSTRIAL APPLICABILITY

The coating liquid of the present invention can be used, for example, for a rinsing liquid of resist solution for ultraviolet light or extreme ultraviolet light, and a composition for formation of a reverse pattern.

The invention claimed is:
1. A coating liquid that is applied to a resist pattern comprising
a polymer having a structural unit of Formula (1):

wherein $R^1$ is a group of Formula (12) or Formula (13):

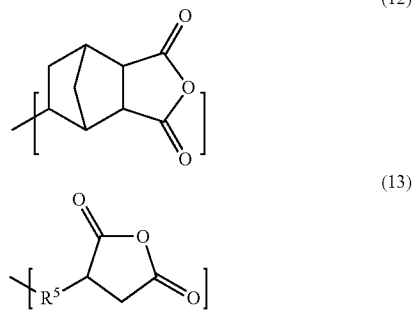

wherein $R^5$ is a linear or branched alkylene group having a carbon atom number of 1 to 3, $R^5$ is bonded to a Si atom in Formula (1), and X is an organic group of Formula (2):

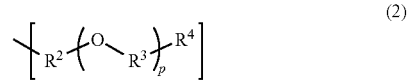

wherein $R^2$ and $R^3$ are each independently a linear or branched alkylene group having a carbon atom number of 1 to 3, $R^2$ is bonded to an oxygen atom in Formula (1), $R^4$ is a $C_{1-4}$ alkoxy group, an allyloxy group, or a hydroxy group, and p is 0, 1, or 2, and
water or a mixture of water and at least one alcohol, wherein a content of the at least one alcohol in the mixture is 10% by mass to 70% by mass.
2. The coating liquid according to claim 1, wherein the polymer further has a structural unit of Formula (3):

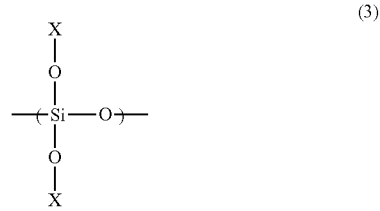

wherein two Xs are each defined the same as in Formula (1).
3. The coating liquid according to claim 2, wherein the polymer is a product obtained by a reaction of a cohydrolysis-condensation product of a compound of Formula (4) and a compound of Formula (5) with a compound of Formula (6):

$$R^1Si(OY)_3 \tag{4}$$

$$Si(OZ)_4 \tag{5}$$

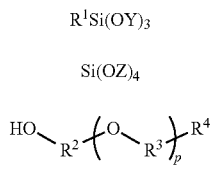
(6)

wherein $R^1$ is defined the same as in Formula (1), Y and Z are each independently a methyl group or an ethyl group, and $R^2$, $R^3$, $R^4$, and p are each defined the same as in Formula (2).

4. A coating liquid that is applied to a resist pattern comprising a polymer having a structural unit of Formula (1):

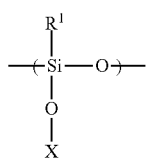
(1)

wherein $R^1$ is selected from the group consisting of linear, branched, or cyclic alkyl groups, vinyl groups, allyl groups, phenyl groups, and groups of Formulae (7) to (13):

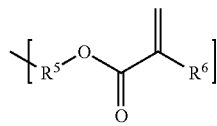
(7)

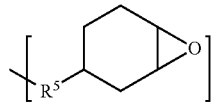
(8)

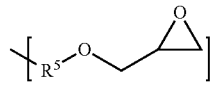
(9)

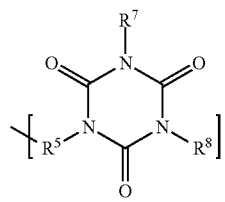
(10)

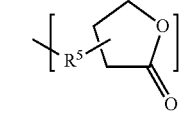
(11)

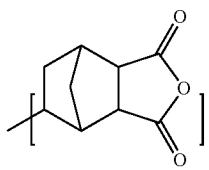
(12)

(13)

wherein $R^5$ is a linear or branched alkylene group having a carbon atom number of 1 to 3, $R^5$ is bonded to a Si atom in Formula (1), $R^6$ is a hydrogen atom or a methyl group, and $R^7$ and $R^8$ are each independently a hydrogen atom or an allyl group, and a solvent consisting of water.

5. The coating liquid according to claim 4, wherein $R^1$ is a group of Formula (11'):

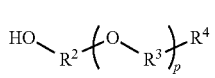
(11')

6. The coating liquid according to claim 1, wherein in the mixture of water and at least one alcohol, the at least one alcohol is a compound of Formula (6):

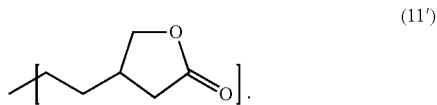
(6)

wherein $R^2$, $R^3$, $R^4$, and p are each defined the same as in Formula (2).

7. The coating liquid according to claim 6, wherein the content of the at least one alcohol in the mixture is 10% by mass to 50% by mass.

8. The coating liquid according to claim 1, wherein the concentration of the polymer is 0.5% by mass to 20% by mass.

9. The coating liquid according to claim 1, wherein the coating liquid is a rinsing liquid.

10. A method for forming a reverse pattern comprising steps of:

applying a positive resist solution to a substrate having an underlayer film, followed by prebaking, to form a resist film;

exposing the resist film;

heating the resist film after the exposure, and developing the resist film by an alkaline developer to form a resist pattern on the substrate having the underlayer film;

applying the coating liquid according to claim 1 to the resist pattern such that at least spaces between patterns of the resist pattern are filled, and removing or decreasing a component other than the polymer contained in the coating liquid and the alkaline developer to form a coating film;

etch-backing the coating film to expose a surface of the resist pattern; and removing the resist pattern.

11. The method for forming a reverse pattern according to claim 10, wherein the component other than the polymer contained in the coating liquid and the alkaline developer are removed or decreased by spin-drying the substrate coated with the coating liquid or by spin-drying the substrate followed by heating.

12. The method for forming a reverse pattern according to claim 10, wherein the step of removing the resist pattern is carried out by dry etching or ashing.

13. A method for producing a semiconductor device comprising, after formation of a reverse pattern by the method according to claim 10, a step of etching the substrate having the underlayer film using the reverse pattern as a mask.

* * * * *